US010985043B2

(12) United States Patent
Narita

(10) Patent No.: US 10,985,043 B2
(45) Date of Patent: Apr. 20, 2021

(54) SUBSTRATE HOUSING CONTAINER

(71) Applicant: MIRAIAL CO., LTD., Tokyo (JP)

(72) Inventor: Yuya Narita, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 0 days.

(21) Appl. No.: 15/778,531

(22) PCT Filed: Nov. 26, 2015

(86) PCT No.: PCT/JP2015/083188
§ 371 (c)(1),
(2) Date: May 23, 2018

(87) PCT Pub. No.: WO2017/090143
PCT Pub. Date: Jun. 1, 2017

(65) Prior Publication Data
US 2018/0358251 A1 Dec. 13, 2018

(51) Int. Cl.
*H01L 21/673* (2006.01)
*H01L 21/677* (2006.01)

(52) U.S. Cl.
CPC .. *H01L 21/67376* (2013.01); *H01L 21/67366* (2013.01); *H01L 21/67383* (2013.01); *H01L 21/67386* (2013.01); *H01L 21/67772* (2013.01)

(58) Field of Classification Search
CPC ......... H01L 21/67376; H01L 21/67383; H01L 21/67772; H01L 21/67366; H01L 21/67386; B65D 85/30; B65D 53/02
USPC ............... 206/701, 710, 711, 723, 722, 449; 220/806, 378
See application file for complete search history.

(56) References Cited

U.S. PATENT DOCUMENTS

| 5,112,065 A | * | 5/1992 | Meyer | E06B 7/2305 220/240 |
| 6,354,601 B1 | * | 3/2002 | Krampotich | H01L 21/67376 206/710 |
| 7,413,099 B2 | * | 8/2008 | Takahashi | B65D 53/02 206/710 |

(Continued)

FOREIGN PATENT DOCUMENTS

| JP | 2002-068364 A | 3/2002 |
| JP | 2005-508809 A | 4/2005 |

(Continued)

OTHER PUBLICATIONS

International Preliminary Report on Patentability for International Application No. PCT/JP2015/083188, 8 pages.

*Primary Examiner* — J. Gregory Pickett
*Assistant Examiner* — Jenine Pagan
(74) *Attorney, Agent, or Firm* — Muncy, Geissler, Olds & Lowe, P.C.

(57) ABSTRACT

A sealing member of this substrate housing container has: a base part-side deformation part that couples the base part and the container contact tip part and is elastically deformable to allow the container contact tip part to oscillate relative to the base part; and a protruding part that is present in the portion of the container contact tip part connected to the base part-side deformation part and that protrudes from the outer surface of the container contact tip part. The thickness of the container contact tip part in the oscillating direction of the container contact tip part is configured to be greater than the thickness of the base part-side deformation part.

4 Claims, 3 Drawing Sheets

(56) References Cited

U.S. PATENT DOCUMENTS

| | | | |
|---|---|---|---|
| 8,720,693 B2* | 5/2014 | Nagashima | H01L 21/67376 |
| | | | 206/711 |
| 8,899,443 B2* | 12/2014 | Soibel | B65D 43/0212 |
| | | | 220/795 |
| 8,928,719 B2* | 1/2015 | Mogi | B41J 2/473 |
| | | | 347/245 |
| 9,426,912 B2* | 8/2016 | Miki | F16J 15/025 |
| 9,520,310 B2* | 12/2016 | Gregerson | H01L 21/67376 |
| 9,887,116 B2* | 2/2018 | Ozawa | H01L 21/67369 |
| 2002/0195455 A1* | 12/2002 | Takahashi | B65D 53/02 |
| | | | 220/806 |
| 2003/0106831 A1 | 6/2003 | Eggum | |
| 2006/0249512 A1* | 11/2006 | Ueda | H01L 21/67126 |
| | | | 220/378 |
| 2009/0261533 A1 | 10/2009 | Inoue | |

FOREIGN PATENT DOCUMENTS

| | | |
|---|---|---|
| JP | 2005-256958 A | 9/2005 |
| JP | 2007-062804 A | 3/2007 |
| JP | 2013-118278 A | 6/2013 |

* cited by examiner

SUBSTRATE HOUSING CONTAINER

TECHNICAL FIELD

The present invention relates to a substrate housing container used when a substrate including a semiconductor wafer and the like is housed, stored, carried, transported, and so on.

BACKGROUND ART

A substrate housing container configured to be provided with a container body and a lid body is conventionally known as a substrate housing container for housing and transporting a substrate including a semiconductor wafer and the like.

An opening peripheral edge section where a container body opening is formed is provided at one end part of the container body. A blocked tubular wall section is provided at the other end part of the container body. A substrate housing space is formed in the container body. The substrate housing space is formed by being surrounded by the wall section and is capable of housing a plurality of substrates. The lid body is detachable with respect to the opening peripheral edge section, has a seal member attachment section, and is capable of blocking the container body opening. A sealing member is attached to the seal member attachment section of the lid body, is capable of being in contact with the opening peripheral edge section, and blocks the container body opening in an airtight state with the lid body by being interposed between the opening peripheral edge section and the lid body and in contact in close contact with the opening peripheral edge section (see, for example, Patent Document 1).

A front retainer is provided in the portion of the lid body that faces the substrate housing space when the container body opening is blocked. The front retainer is capable of supporting the edge sections of the plurality of substrates when the container body opening is blocked by the lid body. In addition, a back-side substrate-supporting part is disposed in the wall section to make a pair with the front retainer. The back-side substrate-supporting part is capable of supporting the edge sections of the plurality of substrates. The back-side substrate-supporting part holds the plurality of substrates, in a state where the adjacent substrates are in parallel at a predetermined interval, by supporting the plurality of substrates in cooperation with the front retainer when the container body opening is blocked by the lid body.

Patent Document 1: Japanese Unexamined Patent Application, Publication No. 2005-256958

DISCLOSURE OF THE INVENTION

Problems to be Solved by the Invention

Preferably, in the substrate housing container, the sealing member has a small gas permeation amount when a substrate is housed in the container body of the substrate housing container and the container body opening of the container body is blocked by the lid body. For example, gas purge is performed after inert gas such as nitrogen or moisture-removed dry air (with a moisture content of 1% or less, hereinafter referred to as purge gas) flows into the substrate housing space from the outside of the container body and the inside of the substrate housing container is pressurized. Preferably, this pressurized state in the substrate housing container is maintained for as long as possible and a rise in humidity in the substrate housing container is suppressed for as long as possible. In this regard, the pressurized state needs to be maintained for an extended period of time and a rise in humidity in the substrate housing container needs to be suppressed for an extended period of time.

An object of the present invention is to provide a substrate housing container in which a pressurized state can be maintained for an extended period of time and a rise in humidity can be suppressed.

Means for Solving the Problems

The present invention relates to a substrate housing container including a container body provided with a tubular wall section having an opening peripheral edge section where a container body opening is formed at one end part with the other end part blocked, capable of housing a plurality of substrates with an inner surface of the wall section, and having a substrate housing space communicating with the container body opening, a lid body detachable with respect to the container body opening, having a seal member attachment section, and capable of blocking the container body opening, and a sealing member attached to the seal member attachment section of the lid body, capable of being in contact with the opening peripheral edge section, and blocking the container body opening in an airtight state with the lid body by being interposed between the opening peripheral edge section and the lid body and in contact in close contact with the opening peripheral edge section, in which the sealing member has a base part fixed to the seal member attachment section, a container contact tip part having a body contact section that comes into contact with the opening peripheral edge section, a base part-side deformation part that couples the base part and the container contact tip part and is elastically deformable to allow the container contact tip part to oscillate relative to the base part, and a protruding part that is present in a portion of the container contact tip part connected to the base part-side deformation part and that protrudes from an outer surface of the container contact tip part, and a thickness of the container contact tip part in an oscillating direction of the container contact tip part is configured to be greater than a thickness of the base part-side deformation part.

Preferably, the thickness of the container contact tip part in the oscillating direction of the container contact tip part is configured to be greater than the thickness of at least a part of the base part-side deformation part. Preferably, the container contact tip part has a bent part bent toward a portion of the opening peripheral edge section with which the body contact section is in contact in a predetermined portion from the protruding part toward the body contact section. Preferably, the sealing member is made of fluororubber.

Effects of the Invention

According to the present invention, a substrate housing container can be provided in which a pressurized state can be maintained for an extended period of time and a rise in humidity can be suppressed.

PREFERRED MODE FOR CARRYING OUT THE INVENTION

Figure 1:
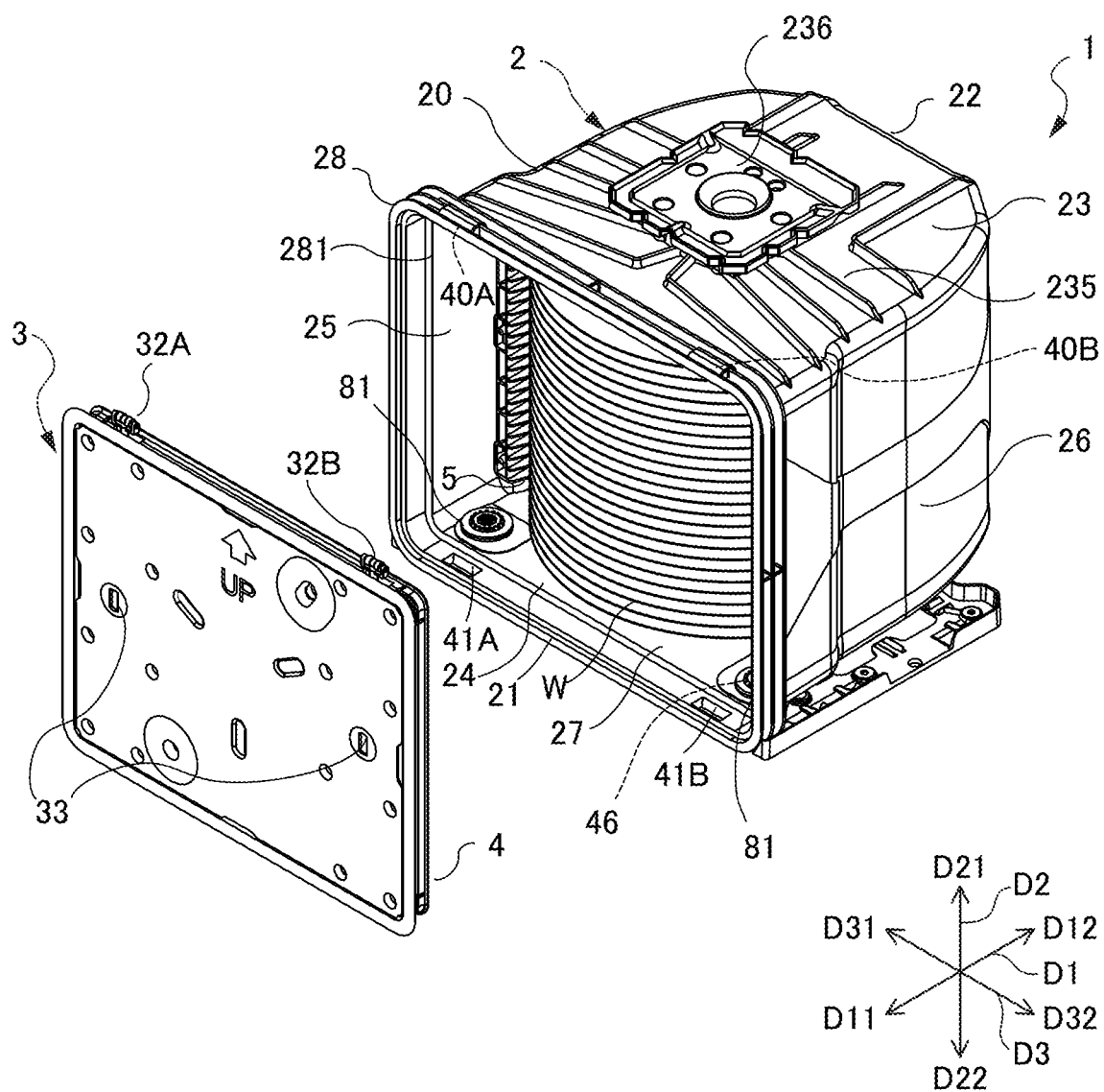
FIG. 1 is an exploded perspective view illustrating a state where a substrate w is housed in a substrate housing container 1 according to a first embodiment of the present invention.
Figure 2:
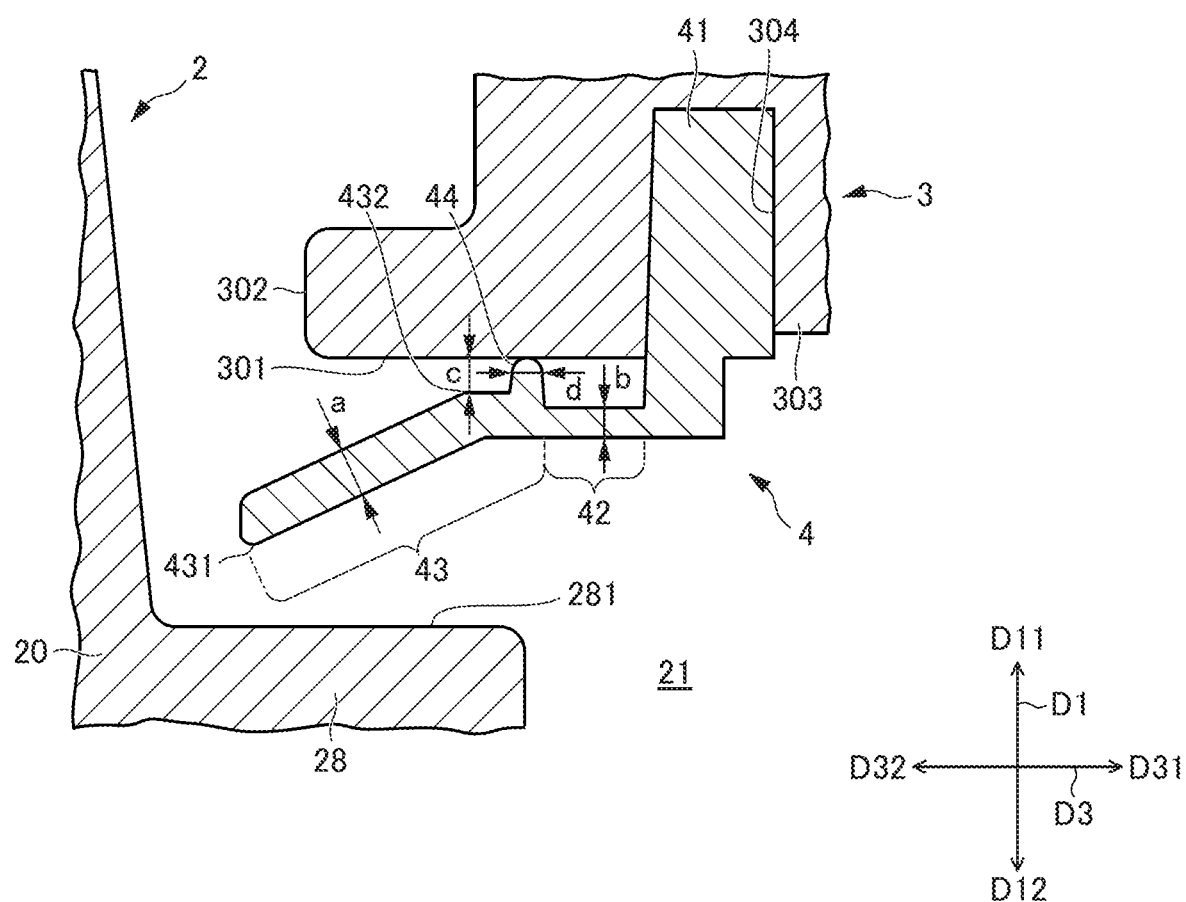
FIG. 2 is an enlarged sectional view illustrating a sealing member 4, a lid body 3, and an opening peripheral edge section 28 in a state where a container body opening 21 of the substrate housing container 1 according to the first embodiment of the present invention is yet to be blocked.
Figure 3:
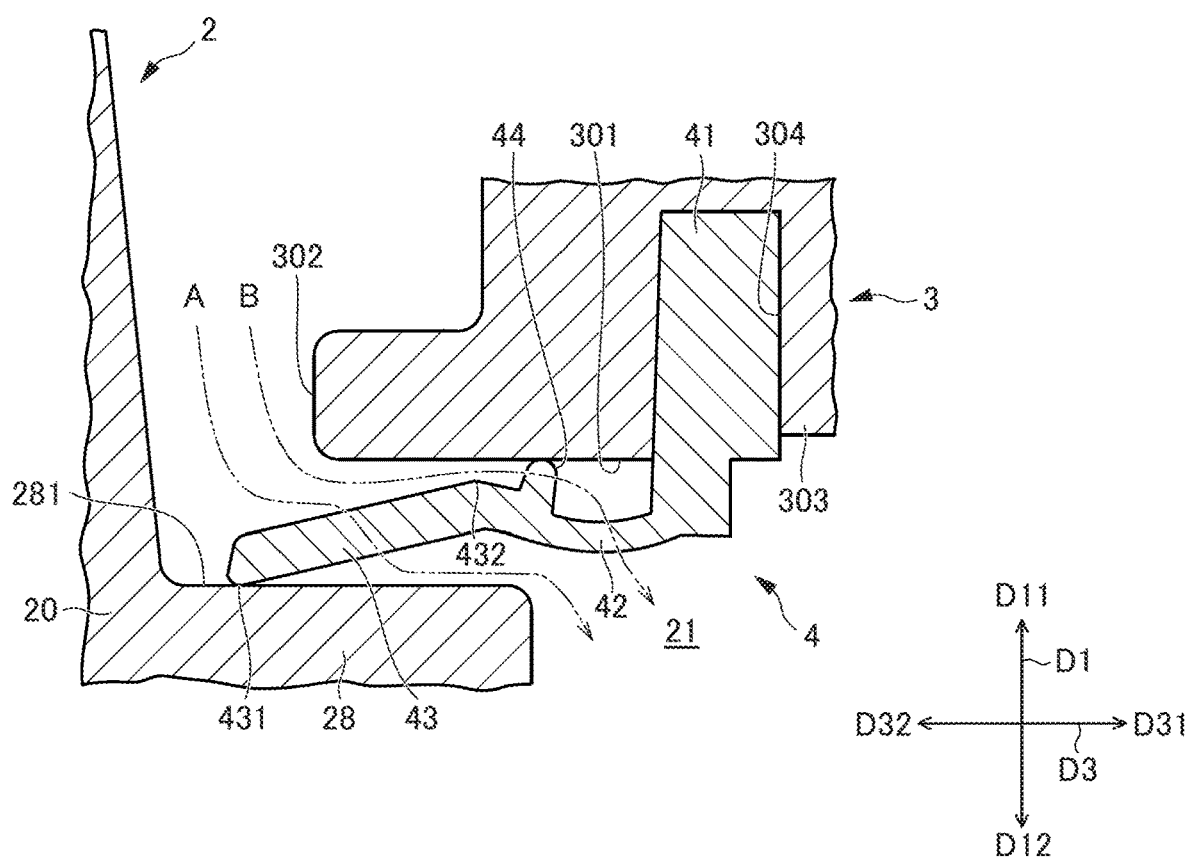
FIG. 3 is an enlarged sectional view illustrating the sealing member 4, the lid body 3, and the opening peripheral edge section 28 at a time when the container body opening 21 of the substrate housing container 1 according to the first embodiment of the present invention is blocked.

Hereinafter, a substrate housing container 1 according to a first embodiment will be described with reference to accompanying drawings. FIG. 1 is an exploded perspective view illustrating a state where a substrate W is housed in the substrate housing container 1 according to the first embodiment of the present invention. FIG. 2 is an enlarged sectional view illustrating a sealing member 4, a lid body 3, and an opening peripheral edge section 28 in a state where a container body opening 21 of the substrate housing container 1 according to the first embodiment of the present invention is yet to be blocked. FIG. 3 is an enlarged sectional view illustrating the sealing member 4, the lid body 3, and the opening peripheral edge section 28 at a time when the container body opening 21 of the substrate housing container 1 according to the first embodiment of the present invention is blocked.

Here, for convenience of description, the direction from a container body 2 (described later) toward the lid body 3 (direction from the upper right toward the lower left in FIG. 1) will be defined as a forward direction D11, the direction that is opposite thereto will be defined as a rearward direction D12, and the forward direction D11 and the rearward direction D12 will be collectively defined as a front-rear direction D1. In addition, the direction from a lower wall 24 (described later) toward an upper wall 23 (upward direction in FIG. 1) will be defined as an upward direction D21, the direction that is opposite thereto will be defined as a downward direction D22, and the upward direction D21 and the downward direction D22 will be collectively defined as an up-down direction D2. In addition, the direction from a second side wall 26 (described later) toward a first side wall 25 (direction from the lower right toward the upper left in FIG. 1) will be defined as a leftward direction D31, the direction that is opposite thereto will be defined as a rightward direction D32, and the leftward direction D31 and the rightward direction D32 will be collectively defined as a left-right direction D3. Arrows indicating the directions are illustrated in the drawings.

The substrate W (refer to FIG. 1) housed in the substrate housing container 1 is a disk-shaped silicon wafer, glass wafer, sapphire wafer, or the like and is a thin one used for industrial purposes. The substrate W according to the present embodiment is a silicon wafer with a diameter of 300 mm.

As illustrated in FIG. 1, the substrate housing container 1 is used as an intra-process container that houses the substrate W which is a silicon wafer as described above and transports the substrate W in a process in a factory, the container body 2 and the lid body 3 constitute the substrate housing container 1, the container body 2 is provided with a substrate-supporting plate-shaped part 5 and a back-side substrate-supporting part (not illustrated), and the lid body 3 is provided with a front retainer (not illustrated).

The container body 2 has a tubular wall section 20, the container body opening 21 is formed at one end part of the wall section 20, and the other end part of the wall section 20 is blocked. A substrate housing space 27 is formed in the container body 2. The substrate housing space 27 is formed by being surrounded by the wall section 20. The substrate-supporting plate-shaped part 5 is disposed in the portion of the wall section 20 that forms the substrate housing space 27. A plurality of the substrates W can be housed in the substrate housing space 27 as illustrated in FIG. 1.

The substrate-supporting plate-shaped part 5 is disposed in the wall section 20 to make a pair in the substrate housing space 27. The substrate-supporting plate-shaped part 5 is capable of supporting the edge sections of the plurality of substrates W, in a state where the adjacent substrates W are in parallel at a predetermined interval, by being in contact with the edge sections of the plurality of substrates W when the container body opening 21 is not blocked by the lid body 3. The back-side substrate-supporting part (not illustrated) is disposed on the back side of the substrate-supporting plate-shaped part 5.

The back-side substrate-supporting part (not illustrated) is disposed in the wall section 20 to make a pair with the front retainer (not illustrated, described later) in the substrate housing space 27. The back-side substrate-supporting part (not illustrated) is capable of supporting the rear parts of the edge sections of the plurality of substrates W by being in contact with the edge sections of the plurality of substrates W when the container body opening 21 is blocked by the lid body 3.

The lid body 3 is detachable with respect to the opening peripheral edge section 28 (FIG. 1 and so on) forming the container body opening 21 and is capable of blocking the container body opening 21. The front retainer (not illustrated) is disposed in the portion of the lid body 3 that faces the substrate housing space 27 when the container body opening 21 is blocked by the lid body 3. The front retainer (not illustrated) is disposed to make a pair with the back-side substrate-supporting part (not illustrated) in the substrate housing space 27.

The front retainer (not illustrated) is capable of supporting the front parts of the edge sections of the plurality of substrates W by being in contact with the edge sections of the plurality of substrates W when the container body opening 21 is blocked by the lid body 3. The front retainer (not illustrated) holds the plurality of substrates W, in a state where the adjacent substrates W are in parallel at a predetermined interval, by supporting the plurality of substrates W in cooperation with the back-side substrate-supporting part (not illustrated) when the container body opening 21 is blocked by the lid body 3.

The substrate housing container 1 is made of resin such as a plastic material and, in a case where there is no particular description, examples of the material resin include a thermoplastic resin such as polycarbonate, a cycloolefin polymer, polyetherimide, polyether ketone, polybutyl terephthalate, polyether ether ketone, and a liquid crystal polymer and alloys thereof. In a case where conductivity is provided, a conductive substance such as a carbon fiber, carbon powder, a carbon nanotube, and a conductive polymer is selectively added to these molding material resins. In addition, a glass fiber, a carbon fiber, and so on can be added for an increase in rigidity.

Each part will be described in detail below. As illustrated in FIG. 1, the wall section 20 of the container body 2 has a back wall 22, the upper wall 23, the lower wall 24, the first side wall 25, and the second side wall 26. The back wall 22, the upper wall 23, the lower wall 24, the first side wall 25, and the second side wall 26 are made of the above-described material and are configured by being integrally molded.

The first side wall 25 and the second side wall 26 face each other, and the upper wall 23 and the lower wall 24 face each other. Each of the rear end of the upper wall 23, the rear end of the lower wall 24, the rear end of the first side wall 25, and the rear end of the second side wall 26 is connected to the back wall 22. The front end of the upper wall 23, the front end of the lower wall 24, the front end of the first side wall 25, and the front end of the second side wall 26 face the back wall 22 in the positional relationship thereof and constitute the opening peripheral edge section 28 forming the container body opening 21 having a substantially rectangular shape.

The opening peripheral edge section 28 is disposed at one end part of the container body 2, and the back wall 22 is positioned at the other end part of the container body 2. The external form of the container body 2 formed by the outer surface of the wall section 20 has a box shape. The inner surfaces of the wall section 20, that is, the inner surface of the back wall 22, the inner surface of the upper wall 23, the inner surface of the lower wall 24, the inner surface of the first side wall 25, and the inner surface of the second side wall 26 form the substrate housing space 27 surrounded thereby. The container body opening 21 formed in the opening peripheral edge section 28 communicates with the substrate housing space 27 surrounded by the wall section 20 and formed in the container body 2. Up to 25 substrates 14 can be housed in the substrate housing space 27.

As illustrated in FIG. 1, latch engagement recesses 40A, 40B, 41A, and 41B recessed toward the outside of the substrate housing space 27 are formed in the portions of the upper wall 23 and the lower wall 24 that are near the opening peripheral edge section 28. A total of four latch engagement recesses 40A, 40B, 41A, and 41B are formed near both left and right end parts of the upper wall 23 and the lower wall 24, respectively.

As illustrated in FIG. 1, a rib 235 is disposed, by being integrally molded with the upper wall 23, on the outer surface of the upper wall 23. The rib 235 increases the rigidity of the container body 2.

In addition, a top flange 236 is fixed to the middle part of the upper wall 23. The top flange 236 is a member that is a portion where the substrate housing container 1 is hung and suspended when the substrate housing container 1 is suspended from an AMHS (automatic wafer transport system), a PGV (wafer substrate transport car), or the like.

Formed as vent channels at the four corners of the lower wall 24 are air supply holes (not illustrated) and exhaust holes 46, which are two types of through holes. In the present embodiment, the through holes in the two places at the end part of the lower wall 24 in the forward direction D11, that is, the two places in the portion of the lower wall 24 close to the container body opening 21 are the exhaust holes 46 for discharging the gas in the container body 2, and the through holes in the two places at the end part in the rearward direction D12, that is, the two places in the portion of the lower wall 24 close to the back wall 22 are the air supply holes (not illustrated) for gas supply into the container. An air supply filter part (not illustrated) and an exhaust filter part 81 are disposed at the air supply hole (not illustrated) and the exhaust hole 46 as the through holes, respectively.

The gas flow paths in the air supply filter part (not illustrated) and the exhaust filter part 81 constitute a part of the vent channel allowing the substrate housing space 27 and the space outside the container body 2 to communicate with each other. In addition, the air supply filter part (not illustrated) and the exhaust filter part 81 are disposed in the wall section 20 having the lower wall 24 and, at the air supply filter part (not illustrated) and the exhaust filter part 81, gas is allowed to pass between the space outside the container body 2 and the substrate housing space 27 through a filter (not illustrated). The air supply filter part (not illustrated) allows at least 20 L (liter) of inert gas such as nitrogen or moisture-removed dry air (with a moisture content of 1% or less, hereinafter referred to as purge gas) to pass per minute from the space outside the container body 2 to the substrate housing space 27. Likewise, the exhaust filter part 81 allows air and the purge gas to pass from the substrate housing space 27 to the space outside the container body 2.

As illustrated in FIG. 1 and so on, the lid body 3 has a substantially rectangular shape that substantially corresponds to the shape of the opening peripheral edge section 28 of the container body 2. The lid body 3 is detachable with respect to the opening peripheral edge section 28 of the container body 2, and the lid body 3 is capable of blocking the container body opening 21 by the lid body 3 being mounted on the opening peripheral edge section 28. An inner surface 301 of the lid body 3 (surface on the back side of the lid body 3 illustrated in FIG. 1, refer to FIG. 2 and so on), which faces the surface (sealing surface 281) of the step part that is formed directly at the position of the opening peripheral edge section 28 in the rearward direction D12 at a time when the container body opening 21 is blocked by the lid body 3, has an annular groove 304 (refer to FIG. 2 and so on) formed to go around the circumference of the lid body 3 in the inner surface 301 of the lid body 3, and the portion of the lid body 3 that forms the annular groove 304 constitutes a seal member attachment section 303. The annular sealing member 4 is attached to the seal member attachment section 303. It is preferable that the sealing member 4 is made of, for example, fluororubber, silicon rubber, or various elastically deformable thermoplastic elastomers such as a polyester-based thermoplastic elastomer and a polyolefin-based thermoplastic elastomer, and the sealing member 4 is made of fluororubber in the present embodiment. The sealing member 4 is disposed to go around the outer peripheral edge section of the lid body 3.

When the lid body 3 is mounted on the opening peripheral edge section 28, the sealing member 4 is capable of being in contact with the opening peripheral edge section 28, is in contact in close contact with the opening peripheral edge section 28, and is elastically deformed by being sandwiched by the sealing surface 281 and the inner surface 301 of the lid body 3, and the lid body 3 is closed with the sealing member 4 in a state where the container body opening 21 is sealed (airtight state). By the lid body 3 being removed from the opening peripheral edge section 28, the substrate W can be put into and taken out from the substrate housing space 27 in the container body 2.

The sealing member 4 has a base part 41, a base part-side deformation part 42, a container contact tip part 43, and a protruding part 44. The base part 41, the base part-side deformation part 42, the container contact tip part 43, and the protruding part 44 are made of fluororubber and configured by being integrally molded. The base part 41 has a substantially rectangular shape in a cross section orthogonal to the circumferential direction of the lid body 3 as illustrated in FIG. 2, the end part of the base part 41 in the rearward direction D12 is notched in the direction from the center of the lid body 3 toward a peripheral edge 302 (leftward direction in FIG. 2), and the base part 41 has a thin part at which the thickness of the base part 41 in the left-right direction D3 is configured to be small. The portion of the base part 41 that is on the upper side of the thin part is fitted into and fixed to the annular groove 304 of the seal member attachment section 303.

As illustrated in FIG. 2, in the cross section orthogonal to the circumferential direction of the lid body 3, the base part-side deformation part 42 extends from the lower end part of the base part 41 along the inner surface 301 of the lid body 3 in the direction from the center of the lid body 3 toward the peripheral edge 302. The extending end part of the base part-side deformation part 42 is connected to the container contact tip part 43. In other words, the base part-side deformation part 42 couples the base part 41 and the container contact tip part 43 and, by being elastically deformed, is capable of oscillating the container contact tip part 43 relative to the base part 41 by using the tip part of the protruding part 44 as a fulcrum in the cross section orthogonal to the circumferential direction of the lid body 3 as illustrated in FIGS. 2 and 3.

As illustrated in FIG. 2 and so on, a thickness a of the container contact tip part 43 in the direction that is orthogonal to the extending direction of the base part-side deformation part 42 and orthogonal to the inner surface 301 of the lid body 3, that is, the oscillating direction of the container contact tip part 43 (described later) is configured to be greater than a thickness b of the base part-side deformation part 42 in the same direction. Specifically, the thickness a of the container contact tip part 43 in the same direction is 0.95 mm whereas the thickness b of the base part-side deformation part 42 in the same direction is 0.8 mm. The thickness b of the base part-side deformation part 42 is constant from the base end part of the base part-side deformation part 42 connected to the base part 41 to the tip side end part connected to the container contact tip part 43. In addition, the thickness a of the container contact tip part 43 is constant from the base end part of the container contact tip part 43 connected to the base part-side deformation part 42 to the tip part of the container contact tip part 43 that is a free end part. Accordingly, the thickness a of a body contact section 431 of the container contact tip part 43 connected to the opening peripheral edge section 28 in the oscillating direction of the container contact tip part 43 is configured to be greater than the thickness of a base part-side deformation part 42b in the same direction.

The container contact tip part 43 extends up to a predetermined position along the inner surface 301 of the lid body 3 in the direction from the center of the lid body 3 toward the peripheral edge 302 from the base end part side that is connected to the base part-side deformation part 42 and has the protruding part 44, is bent by being bent at the position, and linearly extends in the direction of the opening peripheral edge section 28, in the direction from the center of the lid body 3 toward the peripheral edge 302 and diagonally toward the rearward direction D12 to be more specific. The bent portion constitutes a bent part 432, and the extending end part of the container contact tip part 43 constitutes the body contact section 431 in contact with the opening peripheral edge section 28 as illustrated in FIG. 3.

The protruding part 44 is present in the portion of the container contact tip part 43 that is connected to the base part-side deformation part 42. The protruding part 44 protrudes in the forward direction D11 toward the inner surface 301 of the lid body 3 from the outer surface of the container contact tip part 43 that faces the inner surface 301 of the lid body 3. The height of the protruding part 44 from the outer surface of the container contact tip part 43 in the protruding direction of the protruding part 44 is 0.6 mm. The thickness of the protruding part 44 in the direction orthogonal to the protruding direction of the protruding part 44 is 0.6 mm. The tip part of the protruding part 44 has a hemispherical shape, and the radius of the tip part is 0.3 mm.

The lid body 3 is provided with a latch mechanism. The latch mechanism is provided near both left and right end parts of the lid body 3 and is provided with two upper side latch parts 32A and 32B capable of protruding from the upper side of the lid body 3 in the upward direction D21 and two lower side latch parts (not illustrated) capable of protruding from the lower side of the lid body 3 in the downward direction D22 as illustrated in FIG. 1. The two upper side latch parts 32A and 32B are disposed near both left and right ends of the upper side of the lid body 3, and the two lower side latch parts are disposed near both left and right ends of the lower side of the lid body 3.

An operation part 33 is disposed in the outer surface of the lid body 3. By the operation part 33 being operated from the front side of the lid body 3, the upper side latch parts 32A and 32B and the lower side latch parts (not illustrated) are allowed to protrude from the upper and lower sides of the lid body 3 and can be put into a state where the upper side latch parts 32A and 32B and the lower side latch parts (not illustrated) do not protrude from the upper and lower sides. The lid body 3 is fixed to the opening peripheral edge section 28 of the container body 2 when the upper side latch parts 32A and 32B protrude in the upward direction D21 from the upper side of the lid body 3 and are engaged with the latch engagement recesses 40A and 40B of the container body 2 and the lower side latch parts (not illustrated) protrude in the downward direction D22 from the lower side of the lid body 3 and are engaged with the latch engagement recesses 41A and 41B of the container body 2.

A recess (not illustrated) recessed to the outside of the substrate housing space 27 is formed inside the lid body 3 (on the side opposite to the outer surface of the lid body 3 illustrated in FIG. 1). The front retainer (not illustrated) is fixed to and disposed in the recess (not illustrated) and the portion of the lid body 3 outside the recess.

The front retainer (not illustrated) has front retainer substrate receiving parts (not illustrated). Two front retainer substrate receiving parts (not illustrated) are disposed to make a pair at a predetermined interval in the left-right direction D3. 25 pairs of the two front retainer substrate receiving parts disposed to make a pair as described above are disposed in a parallel state in the up-down direction D2. By the lid body 3 being closed with the substrate W housed in the substrate housing space 27, the front retainer substrate receiving parts sandwich and support the end edge of the edge section of the substrate W.

Blocking of the container body opening 21 by the lid body 3 and the sealing member 4 will be described below. Firstly, the inner surface 301 of the lid body 3 is allowed to face the substrate housing space 27 and the lid body 3 is allowed to correspond to the container body opening 21 in the positional relationship thereof when seen in the front-rear direction D1. Then, as illustrated in FIG. 2, the body contact section 431 of the container contact tip part 43 of the sealing member 4 is brought into contact with the opening peripheral edge section 28 by the lid body 3 being moved in the rearward direction D12 and allowed to approach the container body opening 21.

Then, the body contact section 431 of the container contact tip part 43 is pressed against the opening peripheral edge section 28 by the lid body 3 being moved in the rearward direction D12. At this time, the container contact tip part 43 is unlikely to be elastically deformed and the base part-side deformation part 42 is elastically deformed since the container contact tip part 43 is configured to be thicker than the base part-side deformation part 42 as described above. As a result of this elastic deformation, the container contact tip part 43 oscillates substantially in the front-rear direction D1 (oscillating direction) by using the protruding part 44 as a fulcrum (center) as illustrated in FIGS. 2 and 3. In this state, the container body opening 21 is blocked by the lid body 3.

When the container body opening 21 is blocked by the lid body 3 as described above, the thickness of the sealing member 4 blocking communication between the substrate housing space 27 and the outside of the substrate housing container 1 is the thickness of the container contact tip part 43 along the arrow A in FIG. 3 as it is or the sum of the thickness of the protruding part 44 and the thickness of the base part-side deformation part 42 along the arrow B in FIG. 3.

The following effects can be obtained from the substrate housing container 1 according to the embodiment configured as described above. As described above, the substrate housing container 1 is provided with the container body 2 provided with the tubular wall section 20 having the opening peripheral edge section 28 where the container body opening 21 is formed at one end part with the other end part blocked, capable of housing the plurality of substrates W with the inner surface of the wall section 20, and having the substrate housing space 27 communicating with the container body opening 21, the lid body 3 detachable with respect to the container body opening 21, having the seal member attachment section 303, and capable of blocking the container body opening 21, and the sealing member 4 attached to the seal member attachment section 303 of the lid body 3, capable of being in contact with the opening peripheral edge section 28, and blocking the container body opening 21 in an airtight state with the lid body 3 by being interposed between the opening peripheral edge section 28 and the lid body 3 and in contact in close contact with the opening peripheral edge section 28. The sealing member 4 has the base part 41 fixed to the seal member attachment section 303, the container contact tip part 43 having the body contact section 431 that comes into contact with the opening peripheral edge section 28, the base part-side deformation part 42 that couples the base part 41 and the container contact tip part 43 and is elastically deformable to allow the container contact tip part 43 to oscillate relative to the base part 41, and the protruding part 44 that is present in the portion of the container contact tip part 43 connected to the base part-side deformation part 42 and that protrudes from the outer surface of the container contact tip part 43. The thickness of the container contact tip part 43 in the oscillating direction of the container contact tip part 43 is configured to be greater than the thickness of the base part-side deformation part 42.

As a result of this configuration, the base part-side deformation part 42 can be easily deformed whereas deformation of the container contact tip part 43 of the sealing member 4 is unlikely to occur, and thus the elastic force of the sealing member 4 can be reduced. As a result, the abutting contact (surface pressure) of the sealing member 4 with the opening peripheral edge section 28 can be strengthened and the abutting contact (surface pressure) of the sealing member 4 with the opening peripheral edge section 28 can be kept within a predetermined range by the force that is required when the container body opening 21 is blocked with the lid body 3 being kept within a predetermined range.

In addition, when the container body opening 21 is blocked by the lid body 3, the thickness of the container contact tip part 43 of the sealing member 4 blocking communication between the substrate housing space 27 and the outside of the substrate housing container 1 can be sufficiently ensured. The base part-side deformation part 42 is configured to be thinner than the container contact tip part 43, and thus the container contact tip part 43 is capable of oscillating relative to the base part 41 with the thickness thereof sufficiently ensured.

As a result, the gas permeation amount of the sealing member 4 at a time when the substrate W is housed in the container body 2 of the substrate housing container 1 and the container body opening 21 of the container body 2 is blocked by the lid body 3 can be reduced. Accordingly, the pressurized state of the inside of the substrate housing container 1 at a time when the inside of the substrate housing container 1 is pressurized and gas purge is performed can be maintained for a long time, and a rise in humidity in the substrate housing container 1 can be suppressed for a long time.

In addition, the thickness of the container contact tip part 43 in the oscillating direction of the container contact tip part 43 is configured to be greater than the thickness of at least a part of the base part-side deformation part 42. As a result of this configuration, elastic deformation of the base part-side deformation part 42 can be reliably performed, and thus the container contact tip part 43 is capable of oscillating relative to the base part 41 and the body contact section 431 of the container contact tip part 43 can be in contact with the opening peripheral edge section 28 in a reliable manner.

In addition, the container contact tip part 43 has the bent part 432 bent toward the portion of the opening peripheral edge section 28 with which the body contact section 431 is in contact in a predetermined portion from the protruding part 44 toward the body contact section 431. As a result of this configuration, a configuration is possible in which the bent part 432 is provided in the portion of the container contact tip part 43 less likely to be deformed than the base part-side deformation part 42, and a configuration is possible in which the body contact section 431 of the container contact tip part 43 is easily in contact with the opening peripheral edge section 28.

The sealing member 4 is made of fluororubber. As a result of this configuration, the moisture permeation amount of the sealing member 4 can be suppressed.

Figure 4:
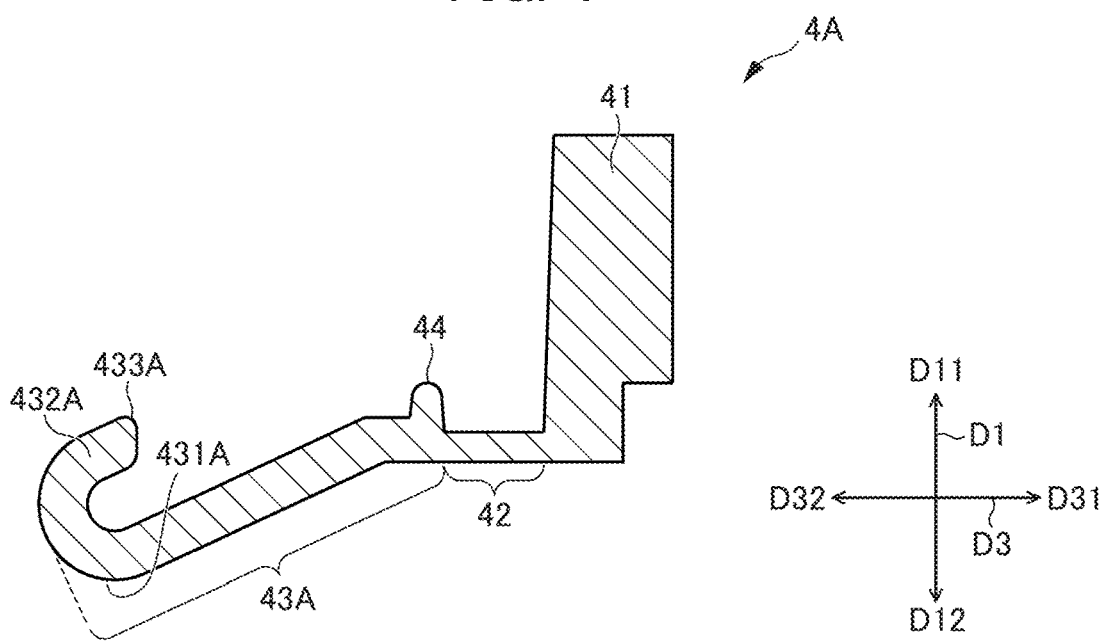
FIG. 4 is an enlarged sectional view illustrating a sealing member 4A of the substrate housing container 1 according to a second embodiment of the present invention.

Hereinafter, a substrate housing container according to a second embodiment of the present invention will be described with reference to FIG. 4. FIG. 4 is an enlarged sectional view illustrating a sealing member 4A of the substrate housing container according to the second embodiment of the present invention.

In the substrate housing container according to the second embodiment, the configuration of the sealing member 4A differs from the configuration of the sealing member 4 of the substrate housing container 1 according to the first embodiment. The rest of the configuration thereof is similar to the configuration of the substrate housing container 1 according to the first embodiment, and thus the same reference numerals will be used to refer to common parts so that the same description is not repeated.

A container contact tip part 43A has a body contact section 431A that is capable of being in contact with the opening peripheral edge section 28 (refer to FIG. 3 and so on). The portion that is closer to the tip part of the container contact tip part 43A than the body contact section 431A is curved in the direction away from the surface of the opening peripheral edge section 28 with which the body contact section 431A is in contact, a tip 433A of the container contact tip part 43A is oriented in the direction of the base part 41, and a tip part 432A of the container contact tip part 43A has a semicircular shape in the cross section orthogonal to the circumferential direction of the lid body 3. Also in this configuration, effects similar to those of the sealing member 4 according to the first embodiment can be obtained.

A test was conducted to try the effects of the present embodiment. In the test, the substrate housing container 1 according to the first embodiment was the product of the present invention. In addition, Comparative Product 1 was a substrate housing container that has a sealing member which is made of fluororubber and has the same shape as the conventional sealing member according to an embodiment of Patent Document 1. In addition, Comparative Product 2 was a substrate housing container that has a sealing member which is made of a polyester elastomer (PEE) and has the same shape as the conventional sealing member 4 according to an embodiment of Patent Document 1. In the test, inert $N_2$ gas was injected, for a predetermined time and by a predetermined amount within a range of approximately 10 L (liter)/min to 30 L/min, through the air supply filter part (not illustrated) in a state where the container body opening 21 was blocked by the lid body 3, and then the $N_2$ gas injection was stopped after relative humidity reached 0%. Subsequently, relative humidity values were obtained four hours after the $N_2$ gas injection was stopped. The result of the test is as shown in Table 1 below.

TABLE 1

|  | Relative humidity |
| --- | --- |
| Product of present invention | 3.8% |
| Comparative Product 1 | 7.8% |
| Comparative Product 2 | 10.4% |

The product of the present invention has a low relative humidity value as shown in Table 1, and it can be seen that the product of the present invention has a low gas permeation amount (moisture permeation amount) in the sealing member 4. In contrast, in Comparative Product 1, which is different in sealing member shape from the product of the present invention and identical in sealing member material to the product of the present invention, the relative humidity value is as high as at least twice the value of the product of the present invention and it can be seen that Comparative Product 1 has a high gas permeation amount (moisture permeation amount) in the sealing member. In Comparative Product 2, which is different in sealing member material from Comparative Product 1 and identical in shape to Comparative Product 1, the relative humidity value is at least 30% higher than the value of Comparative Product 1 and as high as at least 2.7 times the value of the product of the present invention. It can be seen from the above that a sealing member made of fluororubber is lower in gas permeation amount (moisture permeation amount) than a sealing member made of a polyester elastomer (PEE) when the sealing members have the same shape. Also, it can be seen that the sealing member 4 that has the shape according to the first embodiment has an extremely low gas permeation amount (moisture permeation amount).

The present invention is not limited to the embodiments described above and can be modified within the technical scope described in the claims. For example, although the thickness of the base part-side deformation part 42 is constant from the base end part of the base part-side deformation part 42 connected to the base part 41 to the tip side end part connected to the container contact tip part 43, the present invention is not limited thereto. In the oscillating direction of the container contact tip part, the thickness of the container contact tip part may also be configured to be greater than the thickness of at least a part of the base part-side deformation part. Accordingly, the base part-side deformation part may, for example, have partially thick and thin portions in the cross section orthogonal to the circumferential direction of the lid body.

The configuration of the base part, the container contact tip part, the base part-side deformation part, the protruding part, and the like constituting the sealing member is not limited to the configuration of the base part 41, the container contact tip parts 43 and 43A, the base part-side deformation part 42, the protruding part 44, and the like constituting the sealing members 4 and 4A according to the present embodiments.

The shapes of the container body and the lid body and the number and the dimension of the substrates W that can be housed in the container body are not limited to the shapes of the container body 2 and the lid body 3 and the number and the dimension of the substrates W that can be housed in the container body 2 according to the present embodiments. Although the substrate housing container 1 is an intra-process container that houses the substrate N and transports the substrate N in a process in a factory, the present invention is not limited thereto. For example, the substrate housing container may also be a shipping container for housing the substrate N and transporting the substrate N by transport means such as land transport means, air transport means, and shipping means.

EXPLANATION OF REFERENCE NUMERALS

1 Substrate housing container
2 Container body
3 Lid body
4, 4A Sealing member
7 Groove member (contact part)
20 Wall section
21 Container body opening
27 Substrate housing space
28 Opening peripheral edge section
41 Base part
42 Base part-side deformation part
43, 43A Container contact tip part
44 Protruding part
303 Seal member attachment section
431, 431A Body contact section
432 Bent part
W Substrate
a Thickness of container contact tip part
b Thickness of base part-side deformation part

The invention claimed is:

1. A substrate housing container comprising:
a container body provided with a tubular wall section having an opening peripheral edge section where a container body opening is formed at one end part with the other end part blocked, capable of housing a plurality of substrates with an inner surface of the wall section, and having a substrate housing space communicating with the container body opening;

a lid body detachable with respect to the container body opening, having a seal member attachment section, and capable of blocking the container body opening; and a sealing member attached to the seal member attachment section of the lid body, capable of being in contact with the opening peripheral edge section, and blocking the container body opening in an airtight state with the lid body by being interposed between the opening peripheral edge section and the lid body and in contact in close contact with the opening peripheral edge section, wherein the sealing member includes
- a base part fixed to the seal member attachment section,
- a container contact tip part having a body contact section that comes into contact with the opening peripheral edge section,
- a base part-side deformation part that couples the base part and the container contact tip part and is elastically deformable to allow the container contact tip part to oscillate relative to the base part, and
- a protruding part that is not present at the base part-side deformation part, that is present in a portion of the container contact tip part connected to the base part-side deformation part, and that protrudes from an outer surface of the container contact tip part, and wherein thicknesses of the container contact tip part and the base part in an oscillating direction of the container contact tip part are configured to be greater than a thickness of the base part-side deformation part and a portion that is between the base part and the container contact tip part and is thinner than the base part and the container contact tip part constitutes the base part-side deformation part, wherein the base part-side deformation part is thinner than any other portion in the container contact tip part and the base part, wherein the protruding part is constantly in contact with the lid body to which the sealing member having the protruding part is attached, and the seal member is fixed to the lid body in a state in which the protruding part is in contact with an inner surface of the lid body.

2. The substrate housing container according to claim 1,
wherein the thickness of the container contact tip part in the oscillating direction of the container contact tip part is configured to be greater than the thickness of at least a part of the base part-side deformation part.

3. The substrate housing container according to claim 1,
wherein the container contact tip part has a bent part bent toward a portion of the opening peripheral edge section with which the body contact section is in contact in a predetermined portion from the protruding part toward the body contact section.

4. The substrate housing container according to claim 1,
wherein the sealing member is made of fluororubber.

\* \* \* \* \*